United States Patent [19]
Cox et al.

[11] Patent Number: 4,800,337
[45] Date of Patent: Jan. 24, 1989

[54] METHOD AND MEANS FOR DETERMINING A MEASURE OF THE SURFACE POTENTIAL OF A MEDIUM CHARGED BY MEANS OF A CORONA CHARGING DEVICE

[75] Inventors: Jan. J. F. M. Cox, Helden-Beringe; Hendrik Ensing, Velden, both of Netherlands

[73] Assignee: Oce-Nederland B.V., Venlo, Netherlands

[21] Appl. No.: 879,477

[22] Filed: Jun. 27, 1986

[30] Foreign Application Priority Data

Jul. 1, 1985 [NL] Netherlands ............... 8501886

[51] Int. Cl.$^4$ ............................................. G01R 29/12
[52] U.S. Cl. ..................................... 324/455; 250/325; 324/457; 355/14 CH
[58] Field of Search ................. 324/455, 457, 458, 72; 361/229, 235; 250/324, 325; 355/14 CH

[56] References Cited

U.S. PATENT DOCUMENTS 4,189,642  2/1980  Sustus et al. .................... 250/324
4,417,804 11/1983  Werner, Jr. ................... 355/14 CH
4,433,298  2/1984  Palm ............................. 324/457

FOREIGN PATENT DOCUMENTS 1198773 11/1981  Canada ............................. 324/455

Primary Examiner—Gerard R. Strecker
Assistant Examiner—Robert W. Mueller
Attorney, Agent, or Firm—Reed Smith Shaw & McClay

[57] ABSTRACT

A medium to be charged is conveyed past a corona charging device, so that charge emitted by the corona charging device is deposited on the medium surface. A measuring wire disposed between the medium and the corona charging device, but positioned near the medium, collects a part of the emitted charge. A first measuring circuit is used to determine a measure $i_d$ of the charge current collected by the measuring wire. A second measuring circuit determines a measure $i_f$ of that part of the emitted charge current that flows to the medium. In accordance with a predetermined relation, a value E of the surface potential is derived from these measures $i_f$ and $i_d$.

6 Claims, 3 Drawing Sheets

METHOD AND MEANS FOR DETERMINING A MEASURE OF THE SURFACE POTENTIAL OF A MEDIUM CHARGED BY MEANS OF A CORONA CHARGING DEVICE

FIELD OF THE INVENTION

The invention relates to a method of determining a value E of the surface potential of a medium charged by means of a corona charging device, wherein the charge emitted by the corona electrode or electrodes is deposited on the medium surface. A measuring wire is positioned near the charged surface to collect a part of the emitted charge such that value E is derived from the value id of the charge current collected by the measuring wire. The invention also relates to a means for performing the method which includes a measuring wire positioned near the surface to be charged and a first measuring circuit for determining the value $i_d$ and second circuit to measure $i_f$ of that part of the emitted charge current that flows to the medium and deriving the value of E from $i_d$ and $i_f$.

BACKGROUND OF THE INVENTION

Methods and means for determining the electrostatic charge applied to a surface by corona discharge are known, for example. For charging systems generally, see U.S. Pat. No. 3,699,388 and European patent application No. A1,001,886. However, it is also known that these methods and devices are relatively inaccurate. Accordingly, it is an object of the present invention to provide a method and plan determining the value E accurately.

SUMMARY OF THE INVENTION

Generally, the present invention comprises determining a value $i_f$ for the portion of the emitted charge current that is conveyed to the medium and correcting the value E by a correction C dependent upon the measure $i_f$. This correction is derived in accordance with a predetermined relation between the measure $i_f$ and the correction C.

The present invention is based on the discovery that the inaccuracy of measurement is caused primarily by variations in the charge current $i_f$ as the result of variations, for example, in the charging characteristics of the medium to be charged. It is also based on the discovery that the influence of $i_f$ on the measurement can be predicted. The accuracy of the measurement is greatly improved by determining the charge current $i_f$ and then correcting the value E by a value dependent upon the value $i_f$.

In another embodiment of the present invention, the value $i_{tot}$ of the charge current emitted by the corona electrode or electrodes is determined and the measure $i_f$ is derived from the value $i_{tot}$ in accordance with a predetermined relation. The advantage of this embodiment is that the value $i_f$ of that part of the emitted charge current which is conveyed to the medium and which is difficult to measure can be readily determined from the easily measured charge current emitted by the corona electrode or electrodes. This simplification is rendered possible by the fact that the value $i_f$ has been found to be satisfactorily predicted by reference to the value $i_{tot}$.

In another embodiment, the position of the measuring wire is selected so that it collects only charges moving towards the medium surface. This embodiment provides very high sensitivity. Also, it is possible to use a predetermined relation in which $C = K1(i_f) + K2$ where K1 and K2 are constants. Using this correction, value E can easily be approached by means of the predetermined relation.

In the means of the present invention, a second measuring circuit is provided for determining the value $i_f$. This second circuit delivers a second signal which represents the determined value $i_f$. The first and second signals are then directed to a computer circuit for generating an output signal which is in accordance with the predetermined equation and represents the value E. Other advantages will be apparent from a perusal of the following detailed description of presently preferred embodiments of the invention taken in connection with the accompanying drawings.

PRESENTLY PREFERRED EMBODIMENTS

Figure 1:
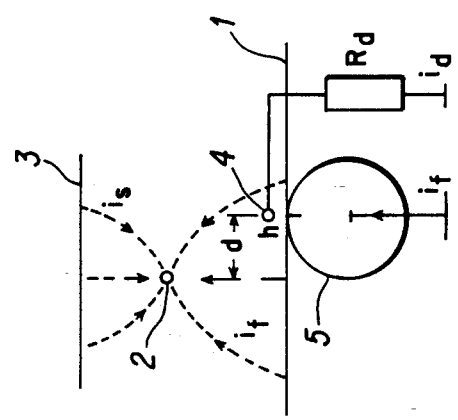
FIG. 1 is a diagram of a corona charging device.

With reference to FIG. 1, photoconductor 1 is moved by drive roller 5 past corona electrode 2 at a distance therefrom. The rear screen 3 or equivalent is indicated diagrammatically at a distance from the corona electrode 2. A measuring wire 4 is clamped over the width of the photoconductor so as to be situated at the back of the corona spray cone. Illustrated diagrammatically in FIG. 1 are photoconductor current $i_f$ and a screen current $i_s$ which result from negative potential $-V_o$ of the corona electrode. Measuring wire 4 is grounded through a low-ohm resistor $R_d$.

Measuring current $i_d$, on the order of a few $\mu$A's, is determined by various factors. First, current $i_d$ is determined by the field strength between the corona electrode and the measuring wire (zero potential) itself. With reasonable accuracy, this part of the current depending on the construction is a fixed part of the photoconductor current $i_f$. A second part of the current is determined by the field strength as a result of the charge level or surface potential (ASV = apparent surface voltage) of photoconductor 1 near the measuring wire 4. An increasing negative charge of the photoconductor will cause this part of the current flowing through the resistor $R_d$ to increase. The signal delivered across the measuring resistor $R_d$ is now approximately equal to: $i_d R_d = K(i_f) + F(ASV) + G$ in which G, K and F are constants and K < 1 and F < 1. By measuring the factor K($i_f$), and since the constant G is fixed, the rest of the signal $i_d R_d$ can be used to control the high-voltage source of corona electrode 2 and, hence, for controlling the surface potential (ASV) of the photoconductor.

Figure 2:
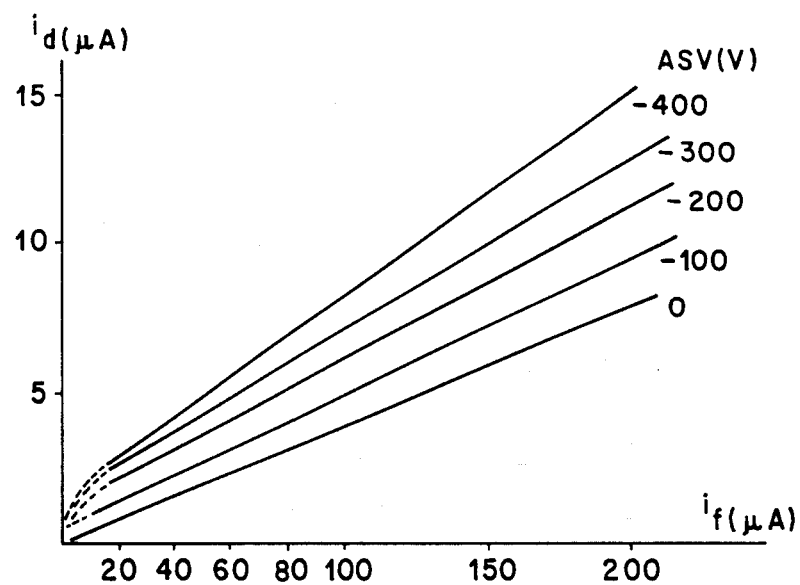
FIG. 2 is a graphical relationship between the wire current and the photoconductor current at different surface potentials of the photoconductor.

FIG. 2 illustrates the relationships between the photoconductor current $i_f$ and the wire current $i_d$ for different surface potentials ASV in the case of a pin corona device. The relationship $i_d/i_f$ is linear except for the foot at the origin. This region ( < 40 $\mu$A), however, is outside the working range and is also unimportant. The constant G indicates the shift of a given line with respect to that of ASV=0. Apart from the dependence of the wire current $i_d$ on the photoconductor current $i_f$ and the surface potential ASV, the positioning (see FIG. 1) of the measuring wire 4 is important.

The value of the wire current increases with increasing h or decreasing d. For a sensitive detector, it is desirable that $di_d/dASV$ be large. This is obtained by making h and d small, e.g., h =about 1 mm. The $i_d$ variations as a result of ASV variations with respect to the absolute value $i_d$, i.e., $(di_d/dASV)|i_d|$ must be large. This can be achieved by making h small.

Figure 3:
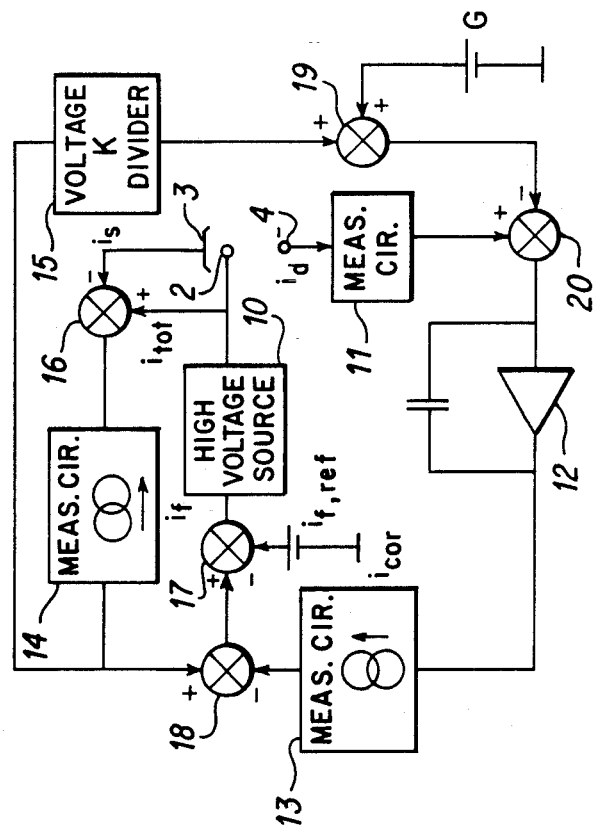
FIG. 3 is a circuit diagram of a preferred embodiment of a first control system for use in the present invention.

FIG. 3 diagrammatically represents an application of the invention to control the surface potential. A high-voltage source 10 feeds the corona electrode 2. The current $i_d$ taken from the measuring wire 4 is converted to voltage in measuring circuit 11 and fed to the differential element 20. The photoconductor current $i_f$ in the measuring circuit 14 is measured in a first feedback loop and converted to a voltage which is compared in the differential element 17 with a voltage corresponding to the required current value $i_{f,ref}$. The result of this differential measurement is fed to the high-voltage source 10 so that a stabilized photoconductor current is obtained.

The voltage in voltage divider 15 corresponding to the $i_f$ current value is divided by the factor K in a second feedback loop and is increased by the value of constant G in the differential element 19. The result is compared, in differential element 20, with the voltage of measuring circuit 11 corresponding to the wire current $i_d$. The output signal of the differential element 20 is the corrected value E of the surface potential. The corrected value E is used as an input signal to an integrating controller 12. The surface potential is so controlled by means of the second integrating feedback loop that value E of the surface potential becomes equal to zero.

The time constant of the integration amplifier 12 is, for example, one second, so that deviations of, for example, 100 V can be corrected within 1 second, i.e., within the time for charging one image area. An ASV deviation, however, is measure as an average over the total photoconductor width so that an ASV variation as high as this over the width generally does not occur.

OPERATION OF CONTROL SYSTEM

Immediately after switching on, the high-voltage supply is controlled for about 50 msec in a preset current mode. This means that the supply acts as a fixed current source, the current setting of which is so selected that the photoconductor charge accompanying it cannot become exceptionally high. This obviates any damage to the photoconductor upon switching on the control system. This precharging interval of 50 msec corresponds to the said transit time between the corona device and the measuring wire. During the interval of time after switching on the control system, there is no signal in the measuring wire. Control in this preset current mode is obtained by setting the gain of the integration amplifier 12 to a minimum, the output voltage being set to the preset value. After that interval, the feedback loop for the ASV control is closed by increasing the integration amplifier gain, e.g., to 180x.

Figure 4:
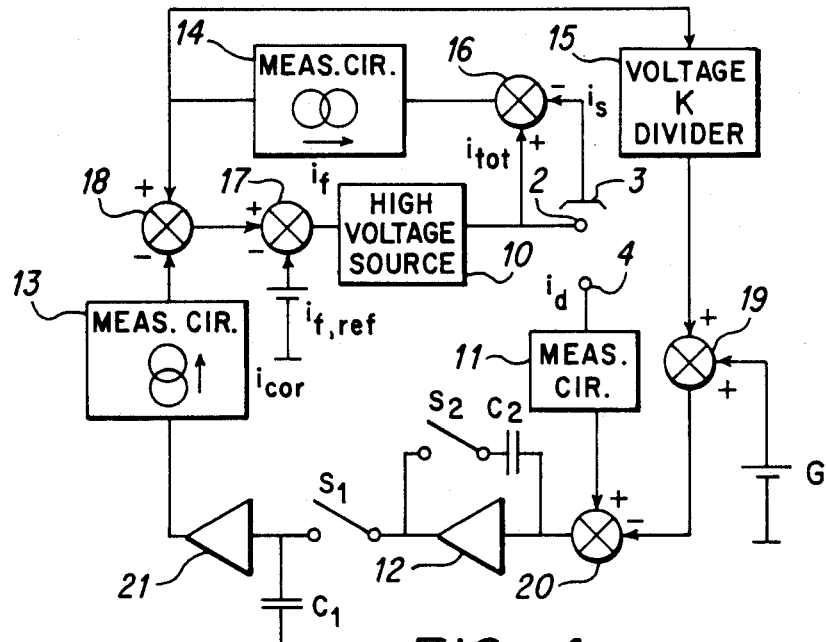
FIG. 4 is a circuit diagram of a preferred embodiment of a second control system for use in the invention.

FIG. 4 diagrammatically represents a control system using the invention. The control system is basically the same as that of FIG. 3, except that buffer amplifier 21 is included and circuit $S_1$ and capacitor $C_1$ to ground are included in the output circuit of integration amplifier 12. Additionally, switch $S_2$ is included in the feedback loop of the integration amplifier 12.

Figure 5:
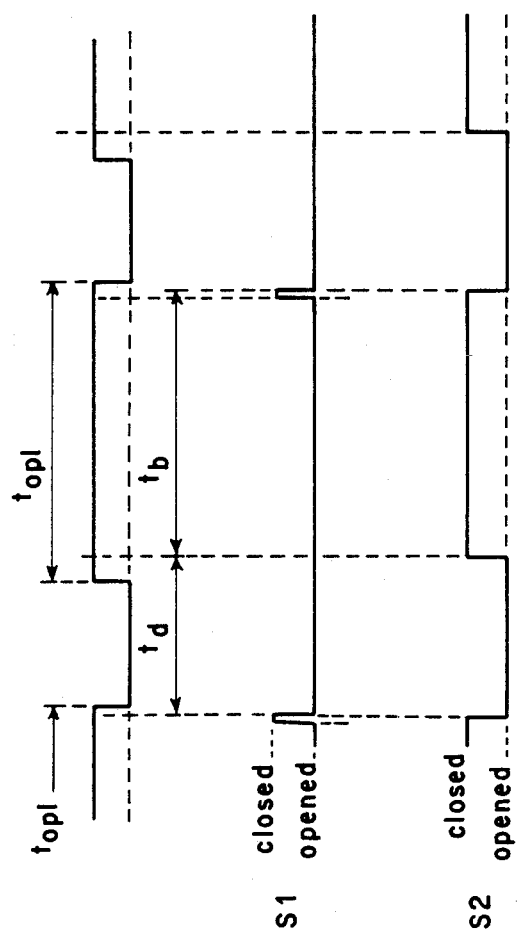
FIG. 5 is a time diagram showing the operation of the control system of FIG. 4.

The operation of this control system will be explained by reference to FIG. 5. During image charging in the interval $t_{opl}$, switch $S_1$ is opened so that high-voltage source 10 is controlled by a signal corrected by a correction signal of constant value from capacitor $C_1$. Switch $S_1$ is briefly closed at the end of the image charging interval $t_{opl}$. Switch $S_2$ is closed during the image movement interval $t_b$ so that in that interval the integration amplifier 12 will determine the correction signal for the next charging. After this image movement interval $t_b$, switch $S_1$, as stated, briefly closes so that capacitor $C_1$ can take over the correction signal from integration capacitor $C_2$. This correction signal from capacitor $C_1$ is used during the precharging interval $t_d$ to correct the control for the high-voltage source.

The substantially open condition of the two switches $S_1$ and $S_2$ is necessary in order to avoid any leakage of the capacitor charges in a standby situation. In this example, each capacitor will hold its voltage approximately 8 hours or more. This also prevents the integration amplifier 12 from coming up against the feed voltage. In order to avoid any influence of the correction signal by short-term charging disturbances, the time constant must be made large, i.e., >5 sec. As a result, after the high-voltage source has been switched on or after a possibly long standby situation, a precharging interval of several seconds has to be applied before a first charging can be made.

It is clear that in this second embodiment no correction takes place during charging by the control system. Control of the high-voltage supply is determined by the correction signal detected during the previous charging. The correction thus lags one charging behind. Also, no precharging path is required in a series of consecutive chargings. Against this, a precharging interval of about 5 seconds must be applied for a first charging or after a possibly long standby situation.

The operation of the control system according to the first embodiment depends on the properties of the photoconductor. In the case of a uniform charging, e.g., ±20V, in which the photoconductor uniformity variations are of low frequency, i.e., there are no abrupt charge variations, the control system selected will operate without problems. The advantage is also that small charging differences within one image area can be corrected directly. When the charging differences are considerable, for example ±50V, and of high frequency, e.g., several abrupt variations per image area, the influence on the control system is measurable and such influence may be undesirable. This problem is obviated in the second embodiment, but a correction of the charging differences in one image area is then impossible.

As described hereinbefore, the invention is suitable primarily for use in control systems for controlling the surface potential of a photoconductor fed past a corona device for charging purposes. However, the invention is equally applicable to those cases in which measurement of the ASV is desirable for other purposes.

In the above-described embodiments of the invention, the value $i_f$ is obtained by determining the difference between the current $i_{tot}$ emitted by the corona electrode and screen current $i_s$. However, in practice, it has been found that the ratio $i_f/i_{tot}$ is approximately constant over a fairly wide area.

Accordingly, value $i_f$ can be easily determined from the value $i_{tot}$ in accordance with the relation $i_f$ K2 $i_{tot}$. Measurement of screen current is then superfluous. Although this determination of the current if is less accurate than the determination of $i_f$ according to the equation $i_f = i_{tot} - i_s$, this method is quite satisfactory in practice if the accuracy of the determination of $i_f$ is not required to satisfy unduly strict requirements.

While presently preferred embodiments of the invention have been shown and described in particularity, it may be otherwise embodied within the scope of the appended claims.

What is claimed is:

1. A method for determining a surface potential value (E) of a charged medium from a wire current ($i_d$) collected by a measuring wire, wherein a charge is emitted by at least one corona electrode and a first portion of the charge comprises a charge current ($i_f$) which is deposited on a surface of the charged medium giving it the surface potential value (E), and wherein the measuring wire is disposed near the surface of the charged medium to collect a second portion of the charge emitted by the corona electrode which comprises the wire current ($i_d$), said method comprising the steps of:
   (a) determining a value of the wire current ($i_d$);
   (b) determining a value for an apparent surface voltage (ASV) from the wire current ($i_d$);
   (c) determining a value of the charge current ($i_f$);
   (d) determining a correction C according to a first predetermined relationship between the correction C and the charge current ($i_f$), correction C varying as the charge current ($i_f$) varies; and
   (e) determining the surface potential value (E) from the apparent surface voltage value (ASV) and correction C.

2. A method according to claim 1, wherein the total charge ($i_{tot}$) emitted by the corona electrode is measured and used to determine the value of the charge current ($i_f$) which is deposited on the surface of the charged medium using a second predetermined relationship.

3. A method according to claim 2 wherein the second predetermined relationship is: $i_{tot} - i_s = i_f$, where $i_s$ is a screen current which is measured.

4. A method according to claim 1 wherein the measuring wire is positioned near the surface of the charged medium such that is measures only charge emitted by the corona electrode and moving toward the charged medium.

5. A method according to claims 1, 2 or 3 wherein the first predetermined relationship between the correction C and the charge current ($i_f$) is: $C = K1(i_f) + K2$, where K1 and K2 are constants.

6. In a means for performing the method according to claims 1, 2, 3 or 4 comprising a measuring wire positioned adjacent to the charged surface and a first measuring circuit for determining the value of the wire current ($i_d$), the measuring circuit providing a first signal representing the value of the wire current ($i_d$), the improvement comprising a second measuring circuit for determining the value of the charge current ($i_f$), the second measuring circuit providing a second signal representing the value of the charge current ($i_f$), and a computer circuit for receiving said first signal and said second signal and generating an output signal representing the surface potential value E in accordance with the first predetermined relation.

* * * * *

UNITED STATES PATENT AND TRADEMARK OFFICE
CERTIFICATE OF CORRECTION

PATENT NO. : 4,800,337
DATED : January 24, 1989
INVENTOR(S) : Cox et al.

It is certified that error appears in the above—identified patent and that said Letters Patent is hereby corrected as shown below:

Column 1, line 13: please delete --id-- and substitute "$\underline{i_d}$" therefor.

Column 4, line 60: please delete --if-- and substitute "$\underline{i_f}$" therefor.

Column 4, line 66: please delete --$i_f$ K2 $i_{tot}$" and substitute "$\underline{i_f = K2\ i_{tot}}$" therefor.

Column 6, line 8: please delete --$i_{tot}-i_s=i_f$-- and substitute "$\underline{i_{tot} - i_s = i_f}$" therefor.

Signed and Sealed this

Tenth Day of October, 1989

Attest:

DONALD J. QUIGG

Attesting Officer

Commissioner of Patents and Trademarks